(12) United States Patent
Shao

(10) Patent No.: US 11,353,174 B2
(45) Date of Patent: Jun. 7, 2022

(54) MULTI-WIRE LIGHT STRING STRUCTURE

(71) Applicant: Blooming International Limited, British West Indies (AI)

(72) Inventor: Shu-Fa Shao, Taipei (TW)

(73) Assignee: Blooming International Limited, British West Indies (AI)

( * ) Notice: Subject to any disclaimer, the term of this patent is extended or adjusted under 35 U.S.C. 154(b) by 0 days.

(21) Appl. No.: 17/088,976

(22) Filed: Nov. 4, 2020

(65) Prior Publication Data

US 2022/0082217 A1 Mar. 17, 2022

(30) Foreign Application Priority Data

Sep. 11, 2020 (CN) .......................... 202010951592.0

(51) Int. Cl.
*F21S 4/10* (2016.01)
*F21V 23/00* (2015.01)
*F21Y 115/10* (2016.01)

(52) U.S. Cl.
CPC .............. *F21S 4/10* (2016.01); *F21V 23/002* (2013.01); *F21Y 2115/10* (2016.08)

(58) Field of Classification Search
CPC .................................. F21S 4/10; F21V 23/002
See application file for complete search history.

(56) References Cited

U.S. PATENT DOCUMENTS

| | | | |
|---|---|---|---|
| 4,761,720 A | 8/1988 | Solow | |
| 4,908,743 A | 3/1990 | Miller | |
| 5,109,324 A | 4/1992 | Ahroni | |
| 5,150,964 A | 9/1992 | Tsui | |
| 5,834,901 A | 11/1998 | Shen | |
| 6,481,875 B1 | 11/2002 | Bryant | |
| 6,609,814 B2 | 8/2003 | Ahroni | |
| 6,777,891 B2 | 8/2004 | Lys et al. | |
| 6,914,194 B2 * | 7/2005 | Fan | F21S 4/24 174/117 F |
| 7,088,904 B2 | 8/2006 | Ryan, Jr. | |
| 7,160,140 B1 | 1/2007 | Mrakovich et al. | |
| 7,186,005 B2 | 3/2007 | Hulse | |
| 7,235,815 B2 | 6/2007 | Wang | |
| 7,926,978 B2 | 4/2011 | Tsai | |

(Continued)

FOREIGN PATENT DOCUMENTS

| | | |
|---|---|---|
| CN | 200982547 Y | 11/2007 |
| CN | 201121811 Y | 9/2008 |

(Continued)

*Primary Examiner* — Rajarshi Chakraborty
*Assistant Examiner* — Nathaniel J Lee
(74) *Attorney, Agent, or Firm* — Christensen, Fonder, Dardi & Herbert PLLC

(57) ABSTRACT

A multi-wire light string structure comprises two insulating parts, plural wires and a LED device. The two insulating parts are arranged with a gap. Each wire includes two ends embedded in the two insulating parts and an exposed section in the gap. The ends of the wires are located on a hypothetical plane, two ends of each wire are located on a hypothetical axis, and at least one exposed section is bent to deviate from the corresponding hypothetical axis. The LED device includes a light emitting side and a mounting side. The LED device is located on an upper side of the hypothetical plane, and the mounting side is soldered to at least two of the exposed sections.

22 Claims, 21 Drawing Sheets

(56) References Cited

U.S. PATENT DOCUMENTS

| | | | |
|---|---|---|---|
| 8,371,716 | B2 | 2/2013 | Shen et al. |
| 8,397,381 | B2 | 3/2013 | Tsai |
| 8,469,750 | B2 | 6/2013 | Chen |
| 8,562,175 | B2 | 10/2013 | Chen |
| 8,568,015 | B2 | 10/2013 | Chen |
| 8,592,845 | B2 | 11/2013 | Chen |
| 8,608,342 | B2 | 12/2013 | Chen |
| 8,853,721 | B2 | 10/2014 | Chen |
| 9,788,384 | B1 | 10/2017 | Harris |
| 9,845,925 | B2 | 12/2017 | Chen |
| 10,184,654 | B1 | 1/2019 | Chen |
| 10,205,073 | B2 | 2/2019 | Altamura |
| 10,288,235 | B1* | 5/2019 | Chen ............... F21V 23/002 |
| 10,288,236 | B1 | 5/2019 | Chen |
| 10,578,260 | B1 | 3/2020 | Chen |
| 10,624,166 | B1 | 4/2020 | Shao |
| 10,697,598 | B1 | 6/2020 | Chen et al. |
| 10,845,036 | B2 | 11/2020 | Shao et al. |
| 10,914,437 | B1 | 2/2021 | Shao |
| 2002/0027778 | A1 | 3/2002 | Ko |
| 2003/0063463 | A1 | 4/2003 | Sloan et al. |
| 2004/0080281 | A1 | 4/2004 | Pan |
| 2004/0165384 | A1 | 8/2004 | Allen |
| 2004/0246718 | A1 | 12/2004 | Fan |
| 2005/0018424 | A1 | 1/2005 | Popovich |
| 2005/0174065 | A1 | 8/2005 | Janning |
| 2006/0158878 | A1 | 7/2006 | Howell |
| 2006/0221609 | A1 | 10/2006 | Ryan, Jr. |
| 2007/0015396 | A1 | 1/2007 | Mrakovich et al. |
| 2007/0177402 | A1 | 8/2007 | Wu |
| 2007/0262725 | A1 | 11/2007 | Koren |
| 2007/0279920 | A1 | 12/2007 | Lin |
| 2008/0049424 | A1 | 2/2008 | Want |
| 2008/0084695 | A1 | 4/2008 | Hsu |
| 2008/0084702 | A1 | 4/2008 | Cheung |
| 2008/0094828 | A1 | 4/2008 | Shao |
| 2008/0174995 | A1 | 7/2008 | Tong |
| 2008/0218092 | A1 | 9/2008 | Chang et al. |
| 2009/0154156 | A1 | 6/2009 | Lo et al. |
| 2009/0278463 | A1 | 11/2009 | Tang |
| 2009/0302771 | A1 | 12/2009 | Peng |
| 2010/0001664 | A1 | 1/2010 | Shih |
| 2010/0157598 | A1 | 6/2010 | Tsai |
| 2011/0062875 | A1 | 3/2011 | Altamura |
| 2011/0074300 | A1 | 3/2011 | Hsu |
| 2011/0148311 | A1 | 6/2011 | Neuman |
| 2011/0215368 | A1 | 9/2011 | Chen |
| 2011/0228535 | A1 | 9/2011 | Shao |
| 2011/0286223 | A1 | 11/2011 | Chen |
| 2011/0303939 | A1 | 12/2011 | Chen |
| 2011/0305022 | A1 | 12/2011 | Chen |
| 2011/0310601 | A1 | 12/2011 | Shao |
| 2012/0039070 | A1 | 2/2012 | Shen et al. |
| 2012/0075863 | A1 | 3/2012 | Chen |
| 2012/0275157 | A1 | 11/2012 | Hsu |
| 2013/0058079 | A1 | 3/2013 | Dellian et al. |
| 2013/0078847 | A1 | 3/2013 | Chen |
| 2013/0181232 | A1 | 7/2013 | Jeromerajan et al. |
| 2013/0249417 | A1 | 9/2013 | Verlinden |
| 2014/0268689 | A1 | 9/2014 | Chen |
| 2014/0268818 | A1 | 9/2014 | Huang et al. |
| 2014/0292214 | A1 | 10/2014 | Hung et al. |
| 2014/0355277 | A1 | 12/2014 | Lin |
| 2015/0008835 | A1 | 1/2015 | Sugiura et al. |
| 2015/0117001 | A1 | 4/2015 | Fan |
| 2016/0047516 | A1 | 2/2016 | Taylor |
| 2016/0123566 | A1 | 5/2016 | Leung |
| 2016/0183338 | A1 | 6/2016 | Loomis et al. |
| 2016/0186940 | A1 | 6/2016 | Del Castillo et al. |
| 2016/0341408 | A1 | 11/2016 | Altamura |
| 2017/0023223 | A1* | 1/2017 | Tsai ............... F21V 19/005 |
| 2017/0038055 | A1 | 2/2017 | Daniels |
| 2017/0108185 | A1 | 4/2017 | He |
| 2017/0295622 | A1 | 10/2017 | Harris |
| 2018/0020519 | A1 | 1/2018 | Harris |
| 2018/0020520 | A1 | 1/2018 | Harris |
| 2018/0172225 | A1 | 6/2018 | Zhao |
| 2018/0172226 | A1 | 6/2018 | Zhao |
| 2019/0234597 | A1 | 8/2019 | Zhu |
| 2019/0277458 | A1 | 9/2019 | Shao |
| 2019/0335559 | A1 | 10/2019 | Shao |
| 2020/0236746 | A1 | 7/2020 | Shao |

FOREIGN PATENT DOCUMENTS

| | | |
|---|---|---|
| CN | 201898147 U | 7/2011 |
| CN | 201966240 U | 9/2011 |
| CN | 202613183 U | 12/2012 |
| CN | 203703878 U | 7/2014 |
| GB | 2 454 546 A | 5/2009 |

* cited by examiner

MULTI-WIRE LIGHT STRING STRUCTURE

CROSS-REFERENCE TO RELATED APPLICATION

The present application claims priority to Chinese Patent Application No. 202010951592.0, filed on Sep. 11, 2020, said application is incorporated by reference in its entirety herein.

FIELD OF THE INVENTION

This disclosure relates to a light string, and in particular, to a multi-wire light string structure.

BACKGROUND

A light string is a linear and flexible lighting device which includes light sources directly soldered to a power cable. To form a light string with LED devices is a common usage.

In the art, to solder the LED devices, the insulation layer of the power cable is partially removed, and then the pads or electrodes of the LED device are soldered to the exposed metal wires. Applying a forward bias voltage to drive the LED device requires only two metal wires. In some cases, the power cable includes additional wires to configure a complete electrical circuit.

In some cases the aforementioned additional wire does not need and cannot have a direct connection relationship with the LED device; otherwise, the electrical circuit will not work. In the existing market demand, a light string is required to have a thin power cable and large-as-possible LED devices. In a thin power cable, the wire diameter is small and the distance between two adjacent metal wires is very small. When the pads or electrodes of the LED device are soldered to the two metal wires providing forward bias, usually the distance between the two metal wires cannot match the distance between the pads of the LED device. Under such circumstance the two metal wires may have to be propped up outward as soldering the LED device. However, when the light string is pulled, the metal wires propped up outward will move inward to produce a shear force on the soldered parts, resulting in solder-joint failure. In addition, solder overflow often occurs on the solder joints, and may contact the additional metal wire to cause a short circuit, making the light string an unusable defective product. Due to the small size of the LED devices, insulation protection is not easy to implement on the LED pads or electrodes, and increases the labor cost and material cost during manufacturing.

SUMMARY

In view of the above problem, this disclosure provides a multi-wire light string structure and associated light string, which can avoid a short circuit between the LED device to a pair of wires and any additional metal wire.

At least one embodiment of this disclosure discloses a multi-wire light string structure, comprising two insulating portions, a plurality of wires and an LED device. The two insulating portions are arranged so as to form a gap G therebetween. Each wire includes two wire portions embedded respectively in the two insulating portions and an exposed wire section in the gap G. The wire portions of the plurality of wires embedded in the two insulating portions are located at a hypothetical plane, and define a hypothetical axis, and at least one exposed wire section is bent to deviate from the corresponding hypothetical axis. The LED device includes a light emitting side and a mounting side. In an embodiment, the light-emitting side is opposite the mounting side, with the light-emitting side being an upper, or top side, and the mounting side being a lower or bottom side. The LED device is located on an upper side of the hypothetical plane, and the mounting side is soldered to at least two of the exposed sections of two wires.

In at least one embodiment, the plurality of wires includes a first wire, a second wire, and a third wire, the exposed section of the third wire is bent and protrudes from a lower side of the hypothetical plane, and the mounting side is soldered to the exposed sections of the first wire and the second wire.

In at least one embodiment, the LED device does not contact the exposed section of the third wire.

In at least one embodiment, the exposed section of the third wire is located between the exposed wire sections of the first wire and the second wire.

In at least one embodiment, the exposed section of the first wire and the exposed section of the second wire are respectively bent to deviate from their corresponding hypothetical axes, and deviate from each other on the hypothetical plane.

In at least one embodiment, the exposed section of the first wire and the exposed section of the second wire respectively includes a bump protruding from the upper side of the hypothetical plane.

In at least one embodiment, the multi-wire light string structure comprises two LED devices, and on the exposed sections of first wire and the second wire the two LED devices are spaced by the bumps.

In at least one embodiment, the exposed sections of the first wire and the second wire are adjacent to each other, the exposed section of the third wire is adjacent to the exposed section of the first wire or the second wire, and the exposed section of the third wire is bent to deviate from its corresponding hypothetical axis and protrudes from a lower side of the hypothetical plane.

In at least one embodiment, the exposed sections of the first wire and the second wire are respectively bent to deviate from their respective corresponding hypothetical axes, and deviate from each other on the hypothetical plane.

In at least one embodiment, the plurality of wires includes a first wire and a second wire, the exposed section of the first wire and the exposed section of the second wire are respectively bent to deviate from their corresponding hypothetical axes, and deviate from each other on the hypothetical plane.

In at least one embodiment, the plurality of wires further includes a third wire, the exposed section of the third wire is coated by an insulating coating layer.

In at least one embodiment, the exposed section of the third wire is bent.

In at least one embodiment, the exposed sections of the first wire and the second wire are adjacent to each other, and the exposed section of the third wire is adjacent to the exposed section of the first wire or the second wire.

In at least one embodiment, the exposed section of the third wire is located between the exposed wires of the first wire and the second wire, so that it is adjacent to both the first wire and the second wire.

Based on the above approach, the multi-wire light string structure of this disclosure can be equipped with a relatively large LED device soldered on wires with a relatively thin wire diameter. The LED device can keep a distance from, without making contact with, the additional wire, which may be a third wire, that does not need to be soldered thereon.

This approach simplifies short-circuit protection measures, and effectively avoids the occurrence of a short-circuit condition between the LED device and the additional wire.

BRIEF DESCRIPTION OF THE DRAWINGS

The present invention will become more fully understood from the detailed description given herein below for illustration only, and thus not limitative of the present invention, wherein.

DETAILED DESCRIPTION

Figure 1:
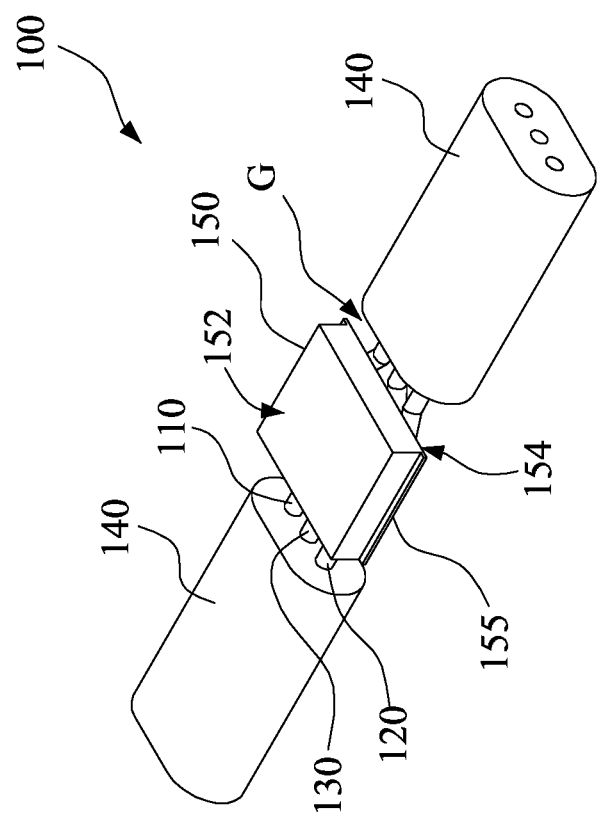
FIG. 1 is a perspective view of a multi-wire light string structure according to a first embodiment of this disclosure.
Figure 2:
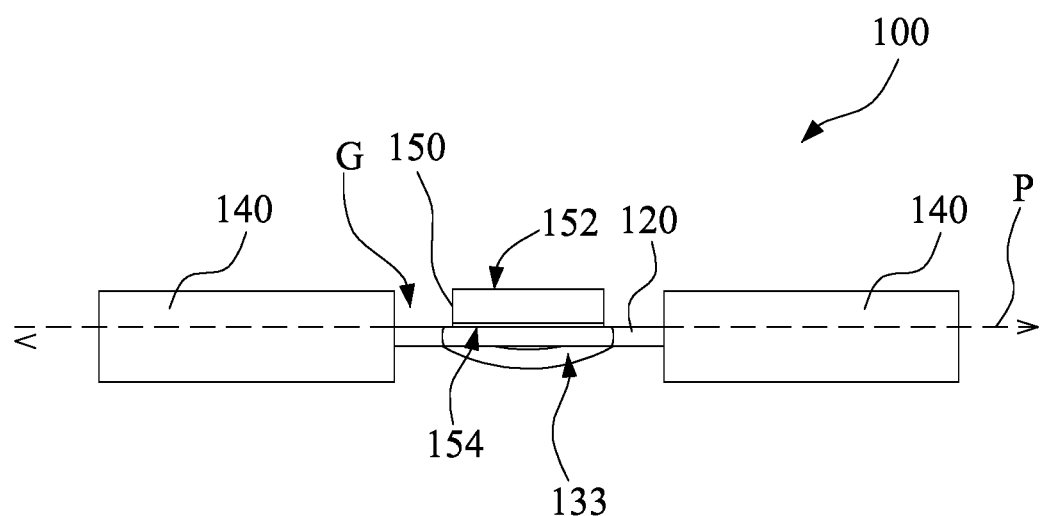
FIG. 2 is a side view of the multi-wire light string structure according to the first embodiment of this disclosure.
Figure 3:
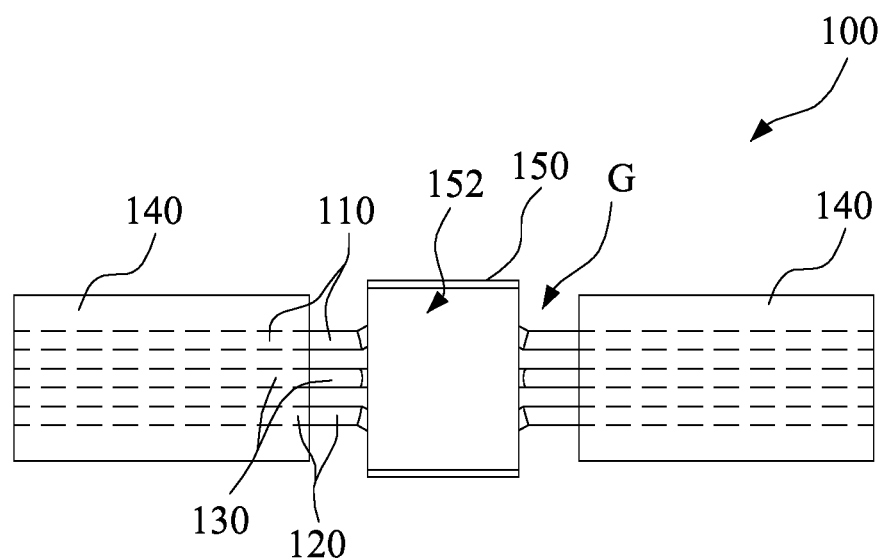
FIG. 3 is a top view of the multi-wire light string structure according to the first embodiment of this disclosure.
Figure 4:
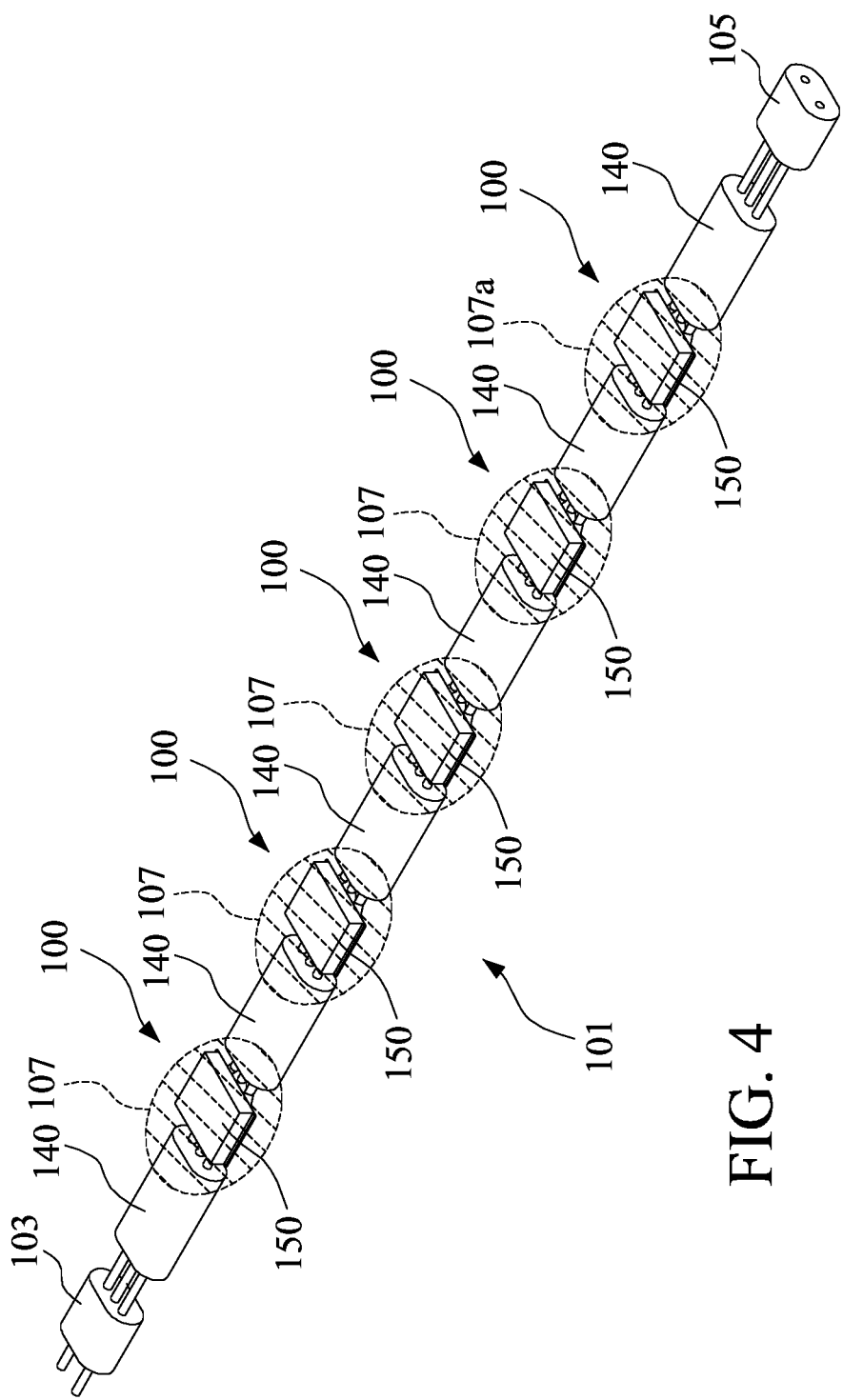
FIG. 4 is a perspective view of a light set of an embodiment of the invention that includes a plurality of multi-wire light string structures.

Referring to FIG. 1, FIG. 2, and FIG. 3, a multi-wire light string structure 100 according to a first embodiment of this disclosure, includes two insulating portions 140, a plurality of wires and an LED device 150. Referring also to FIG. 4, the multi-wire light string structure 100 is a partial structure of a light string 101, and a plurality of multi-wire light string structures 100 may be continuously configured to form the light string 101.

Figure 5:
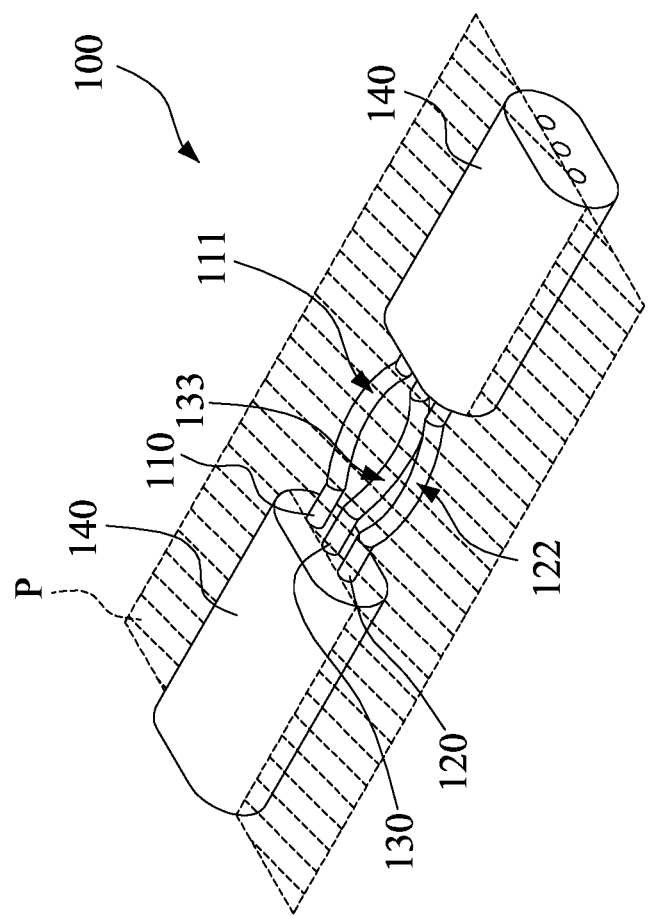
FIG. 5 is a perspective view of the insulating parts, the first wire, the second wire and the third wire according to the first embodiment of this disclosure.
Figure 7:
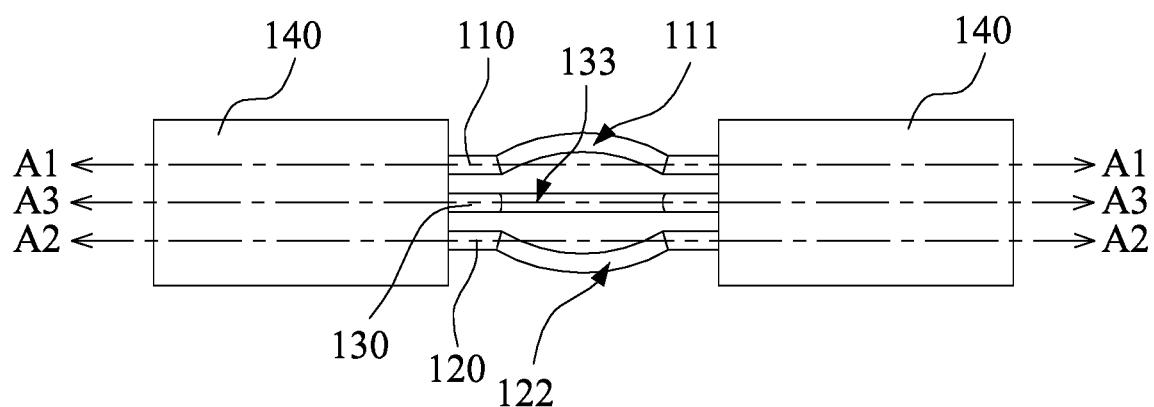
FIG. 7 is a top view of the insulating parts, the first wire, the second wire and the third wire according to the first embodiment of this disclosure.
Figure 8:
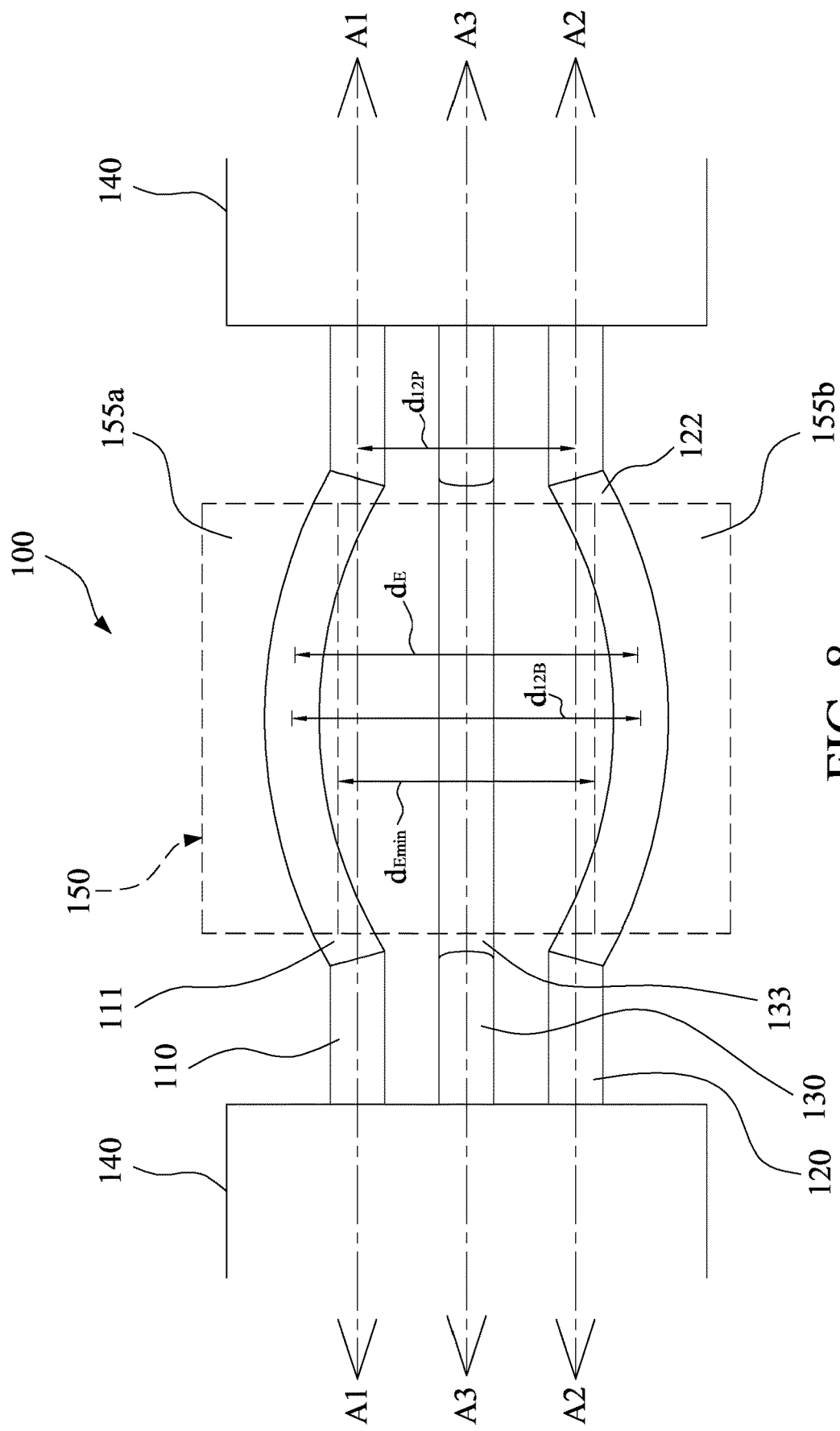
FIG. 8 is a close-up view of an embodiment of the multi-wire light string structure of FIG. 7 depicting relative lengths between wires and structures.

Referring also to FIG. 5, FIG. 7 and FIG. 8, the two insulating portions 140 are arranged to define a gap G, which is between the two insulating portions 140. In the first embodiment, three wires are provided, first wire 110, second wire 120 and third wire 130. The multi-wire light string structure 100 including three wires is merely an example. The multi-line multi-wire light string structure 100 may include only two wires or more than three wires.

Herein, the term "wires" refers to metal conductors that may be a single-strand conductor or a multi-strand conductor. The wires may be embedded in a common insulation portion, such as depicted in FIGS. 1-7, or in other embodiments, described below with respect to, e.g., FIGS. 23-25 may comprise a wire with an insulating coating layer or other wire insulation, in addition to the common insulation and insulation portions 140 described herein.

In embodiments, the wire sizes may be defined by a wire gauge, such as American Wire Gauge (AWG), which defines a cross-sectional size of a wire. In embodiments herein, the wires, including wires 110, 120 and 130, may be within a range of 30 AWG to 18 AWG. More particularly, the wires may be in the smaller-size range, such as 24 AWG to 30 AWG, and more particularly, 26 AWG to 28 AWG, including 27 AWG. LEDs having low-operating current can often utilize very small gauge wires, such as wires smaller than 26 AWG, which can make efficient and reliable attachment of the LEDs to the small diameter wires very challenging, as described further below.

The term "power cable" refers to more than two wires held together by a common structure. In an embodiment, a power cable may comprise two, three or more wires held mechanically together and spaced apart, via an insulating material covering all or portions of the multiple wires. In another embodiment, multiple wires of a power cable may be insulated and held together by another structure, such as a web of material between the insulated wires that connects portions of insulation of the wires. Such a web of material may comprise the same material as the insulation of the wires. In another embodiment, a power cable comprises individual insulated wires held together by a sheath or jacket. As shown in the drawings, the first wire 110 has two portions respectively embedded in the two insulating parts 140 and a first exposed section 111 in the gap G. The second wire 120 has two portions respectively embedded in the two insulating parts 140 and a second exposed section 122 in the gap G. The third wire 130 has two portions respectively embedded in the two insulating portions 140 and a third exposed section 133 in the gap G. In particular, in this embodiment, a plastic coated power cable, which is relatively "flat" as depicted, includes three wires that define a gap G after peeling off the partial plastic cover, so that the plastic covers on each side of the gap G becomes the two insulating portions 140. The plastic cover may comprise an insulating material, such as an insulating plastic like polyvinyl chloride (PVC), or another insulating material. Meanwhile, the three wires respectively form the first wire 110, the second wire 120, and the third wire 130, and the first exposed section 111, the second exposed section 122, and the third exposed section 133 of the wires 110, 120 and 130 are located in the gap G.

Referring specifically to FIG. 4, and as described briefly above, a light string 101, comprises a plurality of multi-wire light string structures connected together. FIG. 4 depicts light string 101 having relatively few multi-wire light string structures 140 and associated LED devices 150, but it will be understood that a light string 101 may have many more structures 100 and LEDs 150, in some cases hundreds, depending on the desired length of the light string 101.

Wires 110, 120 and 130 are generally electrically and mechanically continuous from one multi-wire light string structure 100 to the next adjacent structure 100 to form the light string 101. However, in some portions of the light string 101, a wire 110, 120 or 130 may be interrupted, cut or otherwise discontinuous so as to form particular electrical circuit connections, such as a series, series-parallel or parallel-series connection. Embodiments of three-wire circuits and light strings with cut-off points or points of discontinuity are described in U.S. Pat. No. 10,697,598, entitled "Light Strings and Light-String Circuits," co-owned by the present Applicant, which is incorporated herein by reference in its entirety. In an embodiment, and as described briefly above, a three-wire power cable may have portions of an insulating plastic material or cover removed to form gaps G, wires may be bent as described further below, and LEDs 150 soldered to the wires to form the light set 101.

In an embodiment, light string 101 may include a power plug 103 for connecting to a power source (which may be another light string 101) and may also include an end connector 105 to connect a first light string 101 to a second light string 101. In an embodiment, light string 100 may comprise a seasonal decorative light string configured to be draped on the outside of a live or artificial tree, sculpture, or other structures. In one such embodiment, light string 101 may be configured such that all conductive portions of the light string be sealed or covered so as to prevent a user from coming into contact with "live" electrified portions of the light string, such as portions of wires 110, 120 and 130. In one such embodiment, light string 101 includes a transparent material 107 covering or encapsulating certain portions of each multi-wire light string structure 100, including exposed wire sections 111, 122 and 133, LED device 150, and portions of insulating portions 140.

In an embodiment, transparent material 107 may comprise an adhesive or glue, including an adhesive that is cured with exposure to ultra-violet light. In another embodiment, transparent material 107 is a lens cover or cap mechanically connected to the light string 101 and covering at least LED device 150.

In an embodiment, transparent material 107 contacts portions of insulating portions 140 on a circumferential, outer surface of the insulating portions, as well as at end faces of portions 140, as depicted in FIG. 4 by reference numerals 107. In contrast, a transparent material 107 may cover or contact only end faces of the insulating portions 140, as depicted in FIG. 4 by transparent material 107 labeled as transparent material 107a (same material, different coverage).

Figure 6:
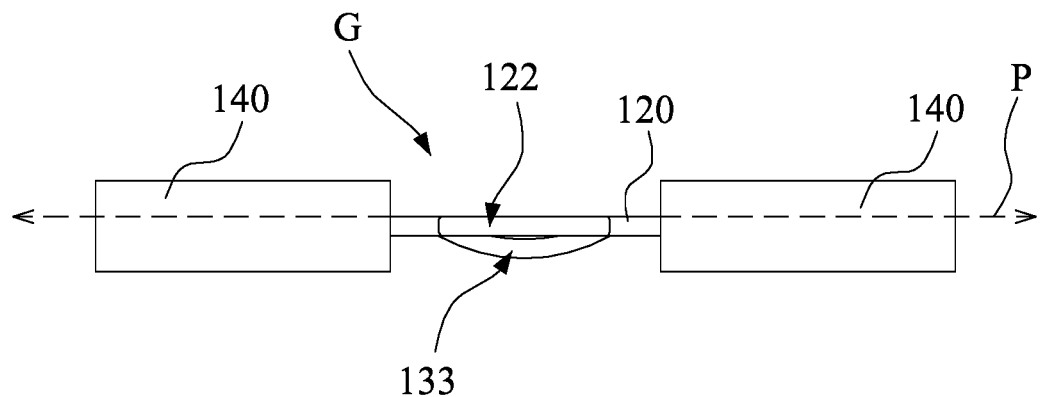
FIG. 6 is a side view of the insulating parts, the first wire, the second wire and the third wire according to the first embodiment of this disclosure.

Referring to FIG. 5, FIG. 6, and FIG. 6, portions of the first wire 110, the second wire 120, and the third wire 130 are located at a hypothetical plane P, and two portions of each wire 110, 120 and 130 extend along respective hypothetical axes A1, A2 and A3, and at least one exposed section is bent to deviate from its corresponding hypothetical wire axis.

Hypothetical plane P and wire axes A1, A2 and A3 are used herein to illustrate and describe the relative positions of the structures of the multi-wire light string structure 100 and light string 101. Plane P is a hypothetical flat plane that extends between a bottom mounting surface 154 of LED device 150 and top surfaces of wires 110, 120 and 130, as depicted. For the sake of illustration, wire axes A1, A2 and A3 are depicted as lengthwise axes extending through a center of each or wires 110, 120 and 130, with the exception of those portions of the wires bent out and away from their respective axes, as described below. It will be understood that wire axes A1, A2 and A3 could also be depicted and described as at or in hypothetical plane P. The axes simply provide a tool to depict and describe deviations of portions of the wires from a lengthwise axis, regardless of whether such a lengthwise axis is depicted as extending through the center of the axis, as shown in the figures, through a non-central portion of the wire, or along an external surface of the wire, which could be at the hypothetical plane P Taking the first embodiment as an illustration, the third exposed section 133 of the third wire 130 is bent to deviate from the corresponding hypothetical axis A3 and the third exposed section 133 protrudes from a lower side of the hypothetical plane P, or outwardly and away from plane P, as well as being bent away from its lengthwise axis A3.

As depicted in FIG. 1, FIG. 2 and FIG. 3, the LED device 150 includes a substrate or base with a light emitting side 152 and a mounting side 154. Mounting side 154 includes first and second electrodes 155, which may comprise an anode and a cathode, or be electrically connected to an anode and a cathode of the LED device. The LED device 150 is located on an upper side of the hypothetical plane P, and the mounting side 154 is soldered to at least two of the exposed sections 111, 122 and 133 of their respective wires 110, 120 and 130. In this first embodiment, the mounting side 154 is soldered to the first exposed section 111 and the second exposed section 122. The third exposed section 133 of the third wire 130 is bent and protrudes downwardly and away from the lower side of the hypothetical plane P, such that the third exposed section 133 also projects away from the LED device 150. Therefore, in an embodiment, the mounting side 154 of the LED device 150 does not, or at a minimum, electrodes 155 do not, contact the third exposed section 133, so as to prevent the third exposed section 133 from causing a short circuit.

In particular, in this embodiment, the first wire 110 and the second wire 120 are used to provide a forward bias voltage to drive the LED device 150 to emit light. The third wire 130 is used to form a complete circuit of the light structure 100 or light string 101, but does not need to be directly connected to the LED device 150 in the gap G. For example, the third wire 130 may be used to electrically connect the first wire 110 and the second wire 120 at one end of the plastic coated cable or one end of the light string 101, and a grounded variable resistor is arranged at the other end to adjust the forward bias voltage between the first wire 110 and the second wire 120. The aforementioned application of the third wire 130 is only an example, and does not limit the application of the third wire 130 in this disclosure.

In another embodiment, LED devices 150 of a plurality of multi-wire light string structures 100 may connected in a parallel-series connection, where a first plurality of LED devices 150 form a first group, with each LED device 150 in the group connected to the other electrically in parallel, and where a second plurality of LED devices 150 form a second group, with each LED device 150 in the second group connected to the other electrically in parallel, and where the first group is electrically connected to the second group in series. Such an electrical configuration may require that different ones of exposed wire sections 111, 122 and 133 for different structures 100 be bent out of plane P and its respective lengthwise axis to avoid contact with a particular LED device 150 so as to form the desired series-parallel connection.

Referring also to FIG. 8, in the first embodiment, the third exposed section 133 is located between the first exposed section L and the second exposed section 122. In this embodiment, the first exposed section 111 and the second exposed section 122 are respectively bent to deviate from their corresponding hypothetical axes A1 and A2, and the first exposed section 111 and the second exposed section 122 deviate from each other in opposite directions on the hypothetical plane P. Therefore, a relatively large distance can be maintained between the first exposed section 111 and the second exposed section 122 to while making contact with an LED device 150 with a larger size, instead of limiting the size of the LED device 150 to the distance between parallel and equidistant portions of the first wire 110 and the second wire 120. Therefore, with the approach of this disclosure, a large-size LED diode device 150 can be soldered to wires with small wire diameters and a small spacing between wires.

Referring specifically to FIG. 8, wires 110, 120 and 130, and their respective exposed sections 111, 122 and 133 are depicted. Various distances "d" are depicted to illustrate distances between wires and to illustrate advantages of the invention. Distance $d_{12P}$ is the distance between wires 110 and 120 at portions of the wire that are in parallel to one another, i.e., not bent or bent away from each other; distance $d_{12B}$ is the distance between bent portions of exposed wire sections 111 and 122. As depicted, distance $d_{12B}$ is greater than distance $d_{12P}$.

Distance $d_E$ is the widthwise distance (or "radial" distance with respect to wire axes A1 and A2) from a widthwise center of first electrode 155a of LED device 150 to a widthwise center of second electrode 155b of LED device 150. In an embodiment, distance $d_E$ may be the same as, or substantially the same as, distance $d_{12B}$ such that respective widthwise centers of each electrode 155a and 155b are positioned over a center of each of exposed wire sections 111 and 122, respectively.

Distance $d_{Emin}$ is the minimum widthwise distance between first electrode 155a and 155b. In an embodiment, $d_{Emin}$ is greater than $d_{12P}$, but less than $d_{12B}$. In such an embodiment, if wires 110 and 120 were not bent radially away from their respective axes A1 and A2, the electrodes 155a and 155b of LED device 150 would not span the required distance between wires 110 and 120, and would not be able to make electrical connection with wires 110 and 120. However, by bending wires 110 and 120, and their respective exposed sections 111 and 121 radially outward and away from each other along plane P, a relatively larger LED device 150, with greater distances between electrodes 155, may be used for the multi-wire light string structure 100 and light string 101.

Figure 9:
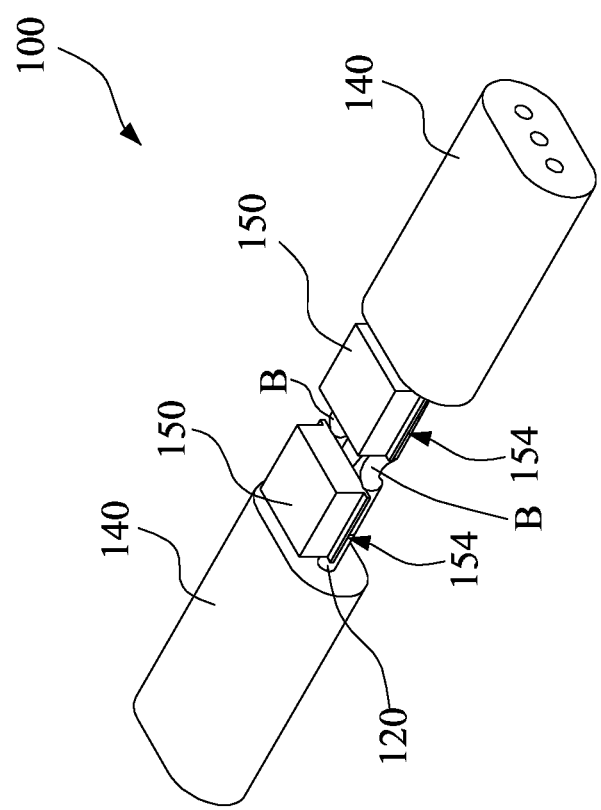
FIG. 9 is a perspective view of a multi-wire light string structure according to a second embodiment of this disclosure.
Figure 10:
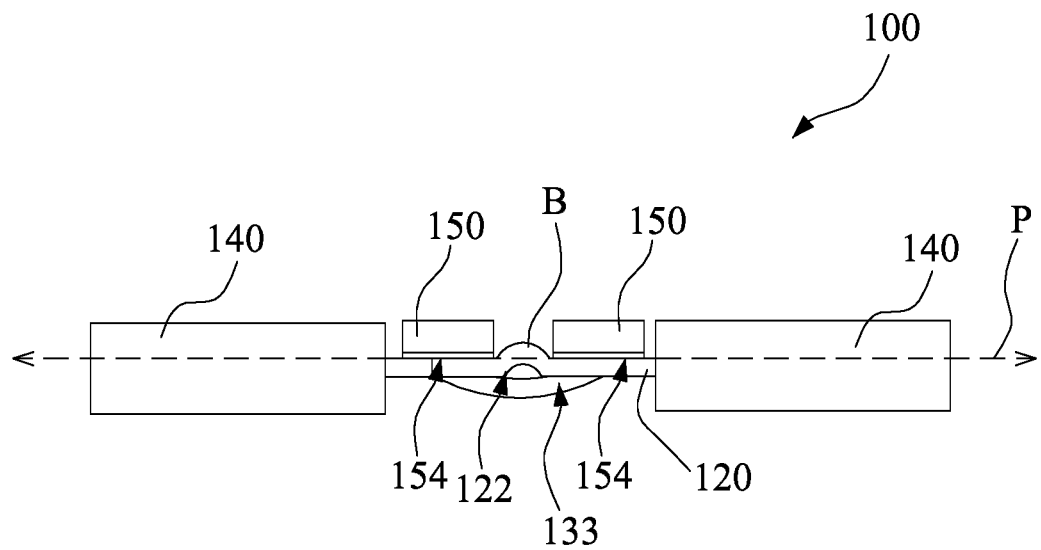
FIG. 10 is a side view of the multi-wire light string structure according to the second embodiment of this disclosure.
Figure 11:
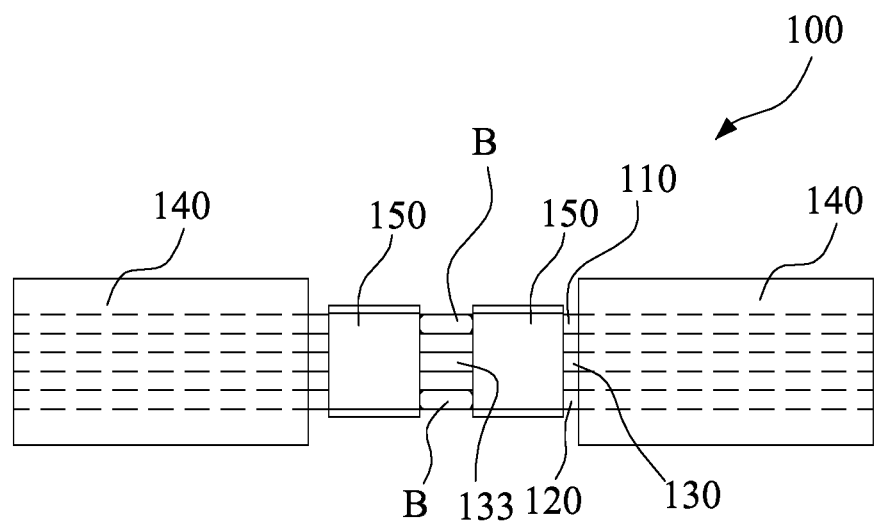
FIG. 11 is a top view of the multi-wire light string structure according to the second embodiment of this disclosure.

Referring now to FIG. 9, FIG. 10, and FIG. 11, a multi-wire light string structure 100 according to a second embodiment of this disclosure, including two insulating portions 140, a first wire 110, a second wire 120, a third wire 130, and two LED devices 150, is depicted. It is understood that a hypothetical plane extends between LED devices 150 and wires 110, 120 and 130, and that each wire 110, 120 and 130 defines a lengthwise axis, similar to those described and depicted with respect to the first embodiment, such that the hypothetical plane and axes will not be repeated in the figures of the second embodiment.

Figure 12:
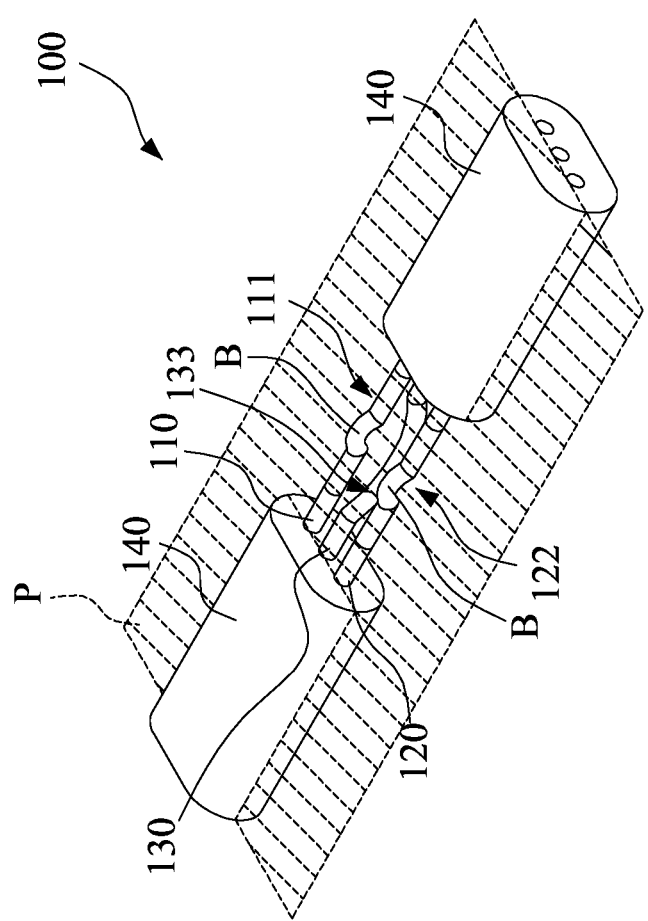
FIG. 12 is a perspective view of the insulating parts, the first wire, the second wire and the third wire according to the second embodiment of this disclosure.
Figure 13:
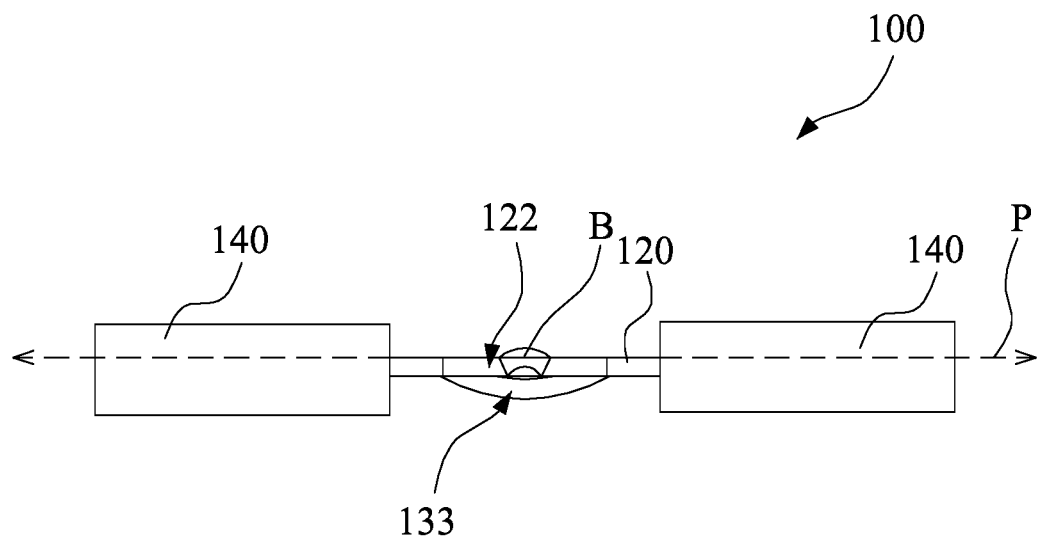
FIG. 13 is a side view of the insulating parts, the first wire, the second wire and the third wire according to the second embodiment of this disclosure.

As shown in FIG. 12, FIG. 13, and FIG. 1, in the second embodiment, the LED devices 150 may be relatively small devices, and the two LED devices 150 are arranged in the same gap G. The two LED devices 150 are located on the upper side of the hypothetical plane, and the mounting sides 154 are soldered to the first exposed section 111 and the second exposed section 122. The third exposed section 133 is bent to deviate from its corresponding lengthwise hypothetical axis and protrudes from the lower side of the hypothetical plane, in a downward direction away from mounting side 154 and the hypothetical plane. In this embodiment, since the size of each LED device 150 is relatively small, the first exposed section 111 and the second exposed section 122 of the second embodiment may not need to be bent away from each other.

Figure 14:
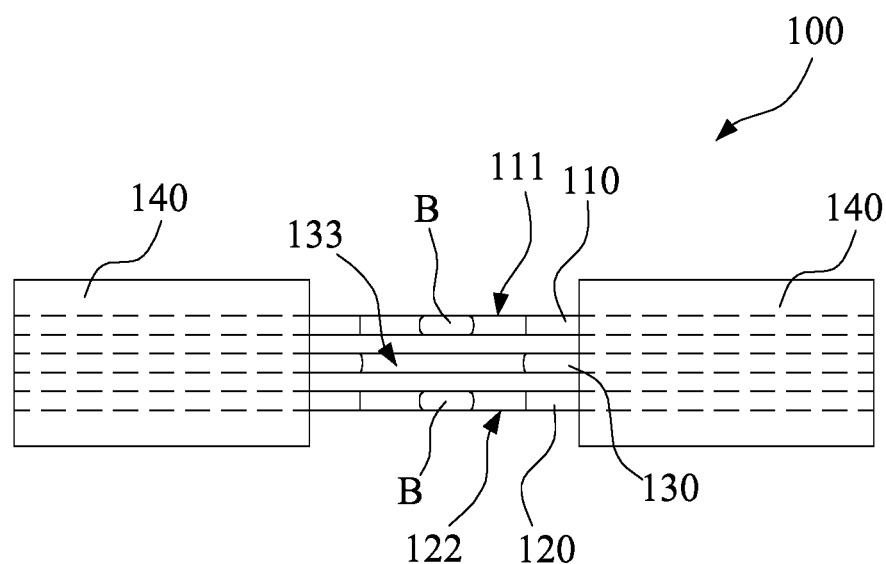
FIG. 14 is a top view of the insulating parts, the first wire, the second wire and the third wire according to the second embodiment of this disclosure.

As shown in FIG. 12, FIG. 13, and FIG. 14, in order to reliably separate the two LED devices 150, the first exposed section 111 and the second exposed section 122 respectively have bumps B protruding from the upper side of the hypothetical plane. The bump B can be formed by soldering a small portion of a material, such as solder, or simply bending the first exposed section 111 and the second exposed section 122 in an upward direction out of the horizontal plane and radially away from their respective lengthwise axes. As shown in FIG. 9, FIG. 10, and FIG. 11, the two LED devices 150 are separated by bumps B on the first exposed section 111 and the second exposed section 122, so that a spacing distance can be maintained between the two LED devices 150, particularly during placement and subsequent soldering to the wires.

Based on the circuit configuration, the third wire 130 that does not contact the LED device 150 is not necessarily located between the first wire 110 and the second wire 120.

Figure 15:
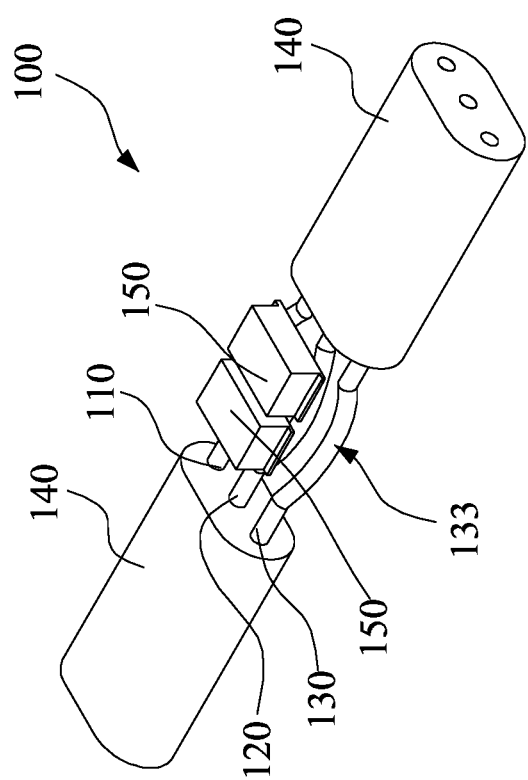
FIG. 15 is a perspective view of a multi-wire light string structure according to a third embodiment of this disclosure.
Figure 16:
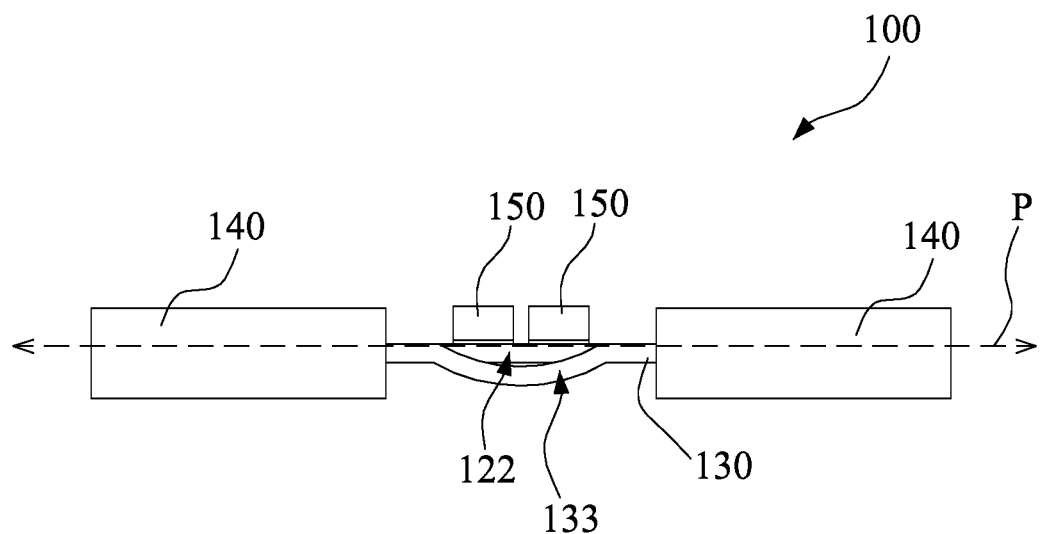
FIG. 16 is a side view of a multi-wire light string structure according to a third embodiment of this disclosure.
Figure 17:
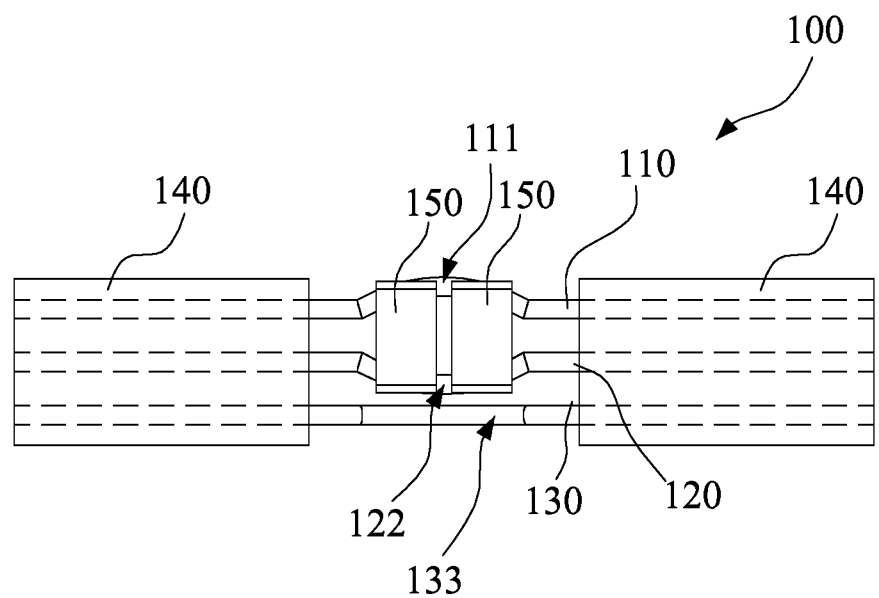
FIG. 17 is a top view of a multi-wire light string structure according to a third embodiment of this disclosure.

Referring to FIG. 15, FIG. 16, and FIG. 17, a multi-wire light string structure 100 according to a third embodiment of this disclosure, including two insulating portions 140, a first wire 110, a second wire 120, a third wire 130, and two LED devices 150, is depicted.

Figure 18:
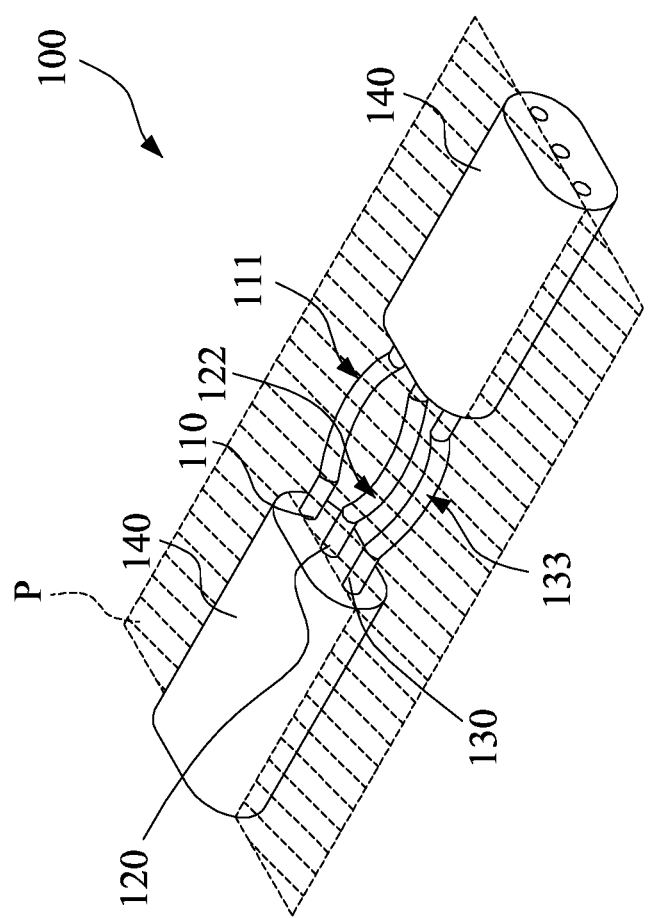
FIG. 18 is a perspective view of the insulating parts, the first wire, the second wire and the third wire according to the third embodiment of this disclosure.
Figure 19:
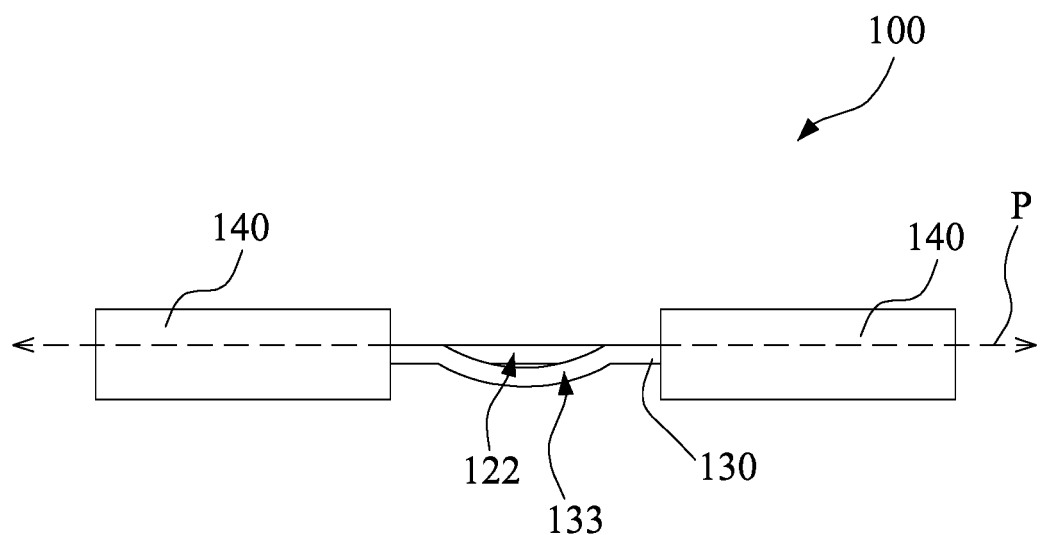
FIG. 19 is a side view of the insulating parts, the first wire, the second wire and the third wire according to the third embodiment of this disclosure.
Figure 20:
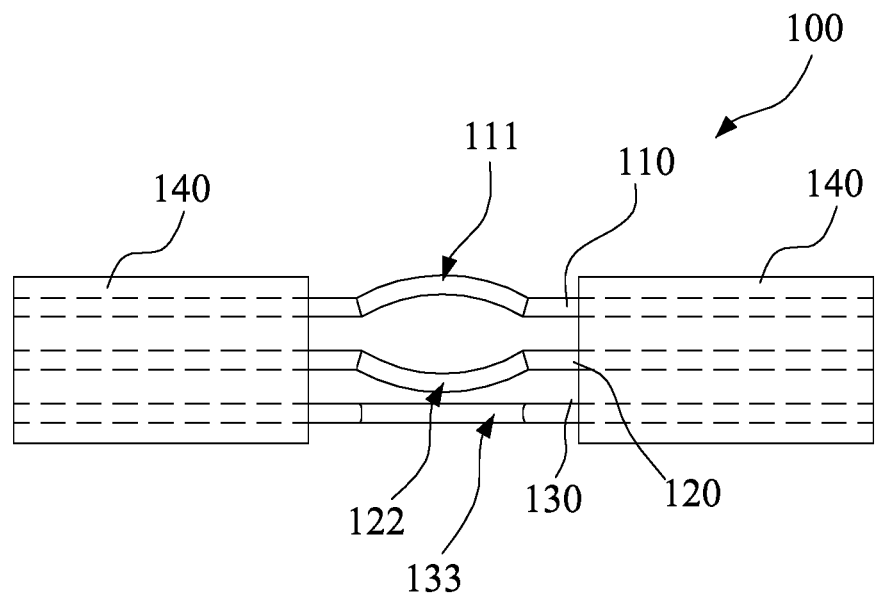
FIG. 20 is a side view of the insulating parts, the first wire, the second wire and the third wire according to the third embodiment of this disclosure.

As shown in FIG. 18, FIG. 19, and FIG. 20, in the third embodiment, the first exposed section 111 and the second exposed section 122 are adjacent to each other, and the third exposed section 133 is adjacent to the first exposed section 111 or the second exposed section 122. The third exposed section 133 is bent to deviate from its corresponding hypothetical axis and protrudes from the lower side of the hypothetical plane.

As shown in FIG. 15, FIG. 16, and FIG. 17, the LED device 150 is located on an upper side of the hypothetical plane, and the mounting sides 154 are soldered to the first exposed section 111 and the second exposed section 122. When the distance between the first wire 110 and the second wire 120 is too small to match the width of the LED device 150, or the distance between electrodes of the LED device 150, the first exposed section 111 and the second exposed section 122 are respectively bent to deviate from their corresponding hypothetical axes and deviate from each other in the hypothetical plane P, so as to match the width of the LED device 150. In this embodiment the third exposed section 133 protrudes downwardly and away from the lower side of the hypothetical plane, which can prevent the first exposed section 111 or the second exposed section 122 from contacting the third exposed section 133. Similarly, even if a bump B is not provided, the multi-wire light string structure 100 can still be equipped with two led devices 150 as long as the distance between the two LED devices 150 is maintained during placement and soldering.

Figure 21:
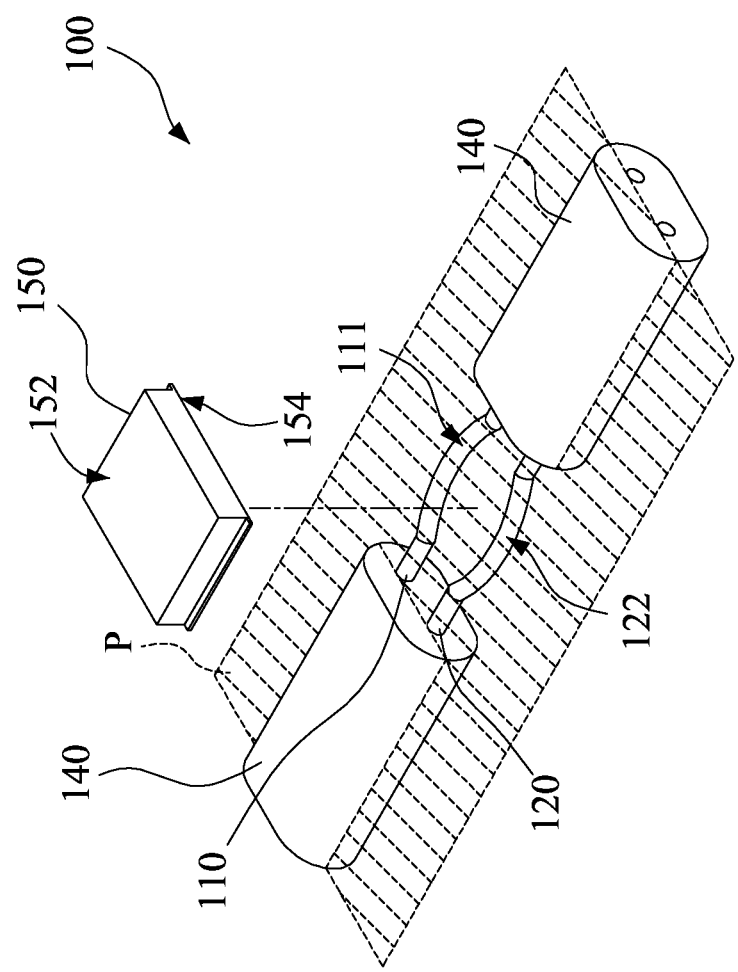
FIG. 21 is an exploded view of a multi-wire light string structure according to a fourth embodiment of this disclosure.
Figure 22:
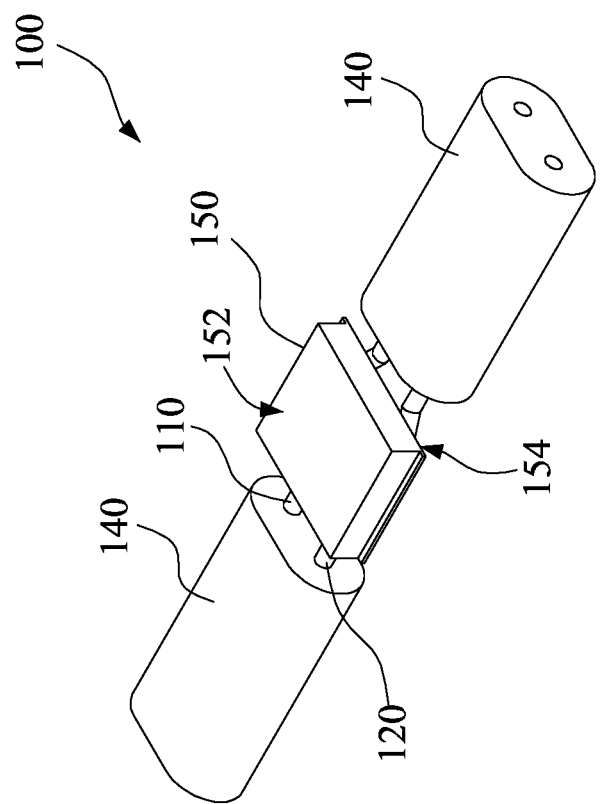
FIG. 22 is a perspective view of a multi-wire light string structure according to a fourth embodiment of this disclosure.

Referring to FIG. 21 and FIG. 22, a multi-wire light string structure 100 according to a fourth embodiment of this disclosure, including two insulating portions 140, a plurality wires and a LED device 150, is depicted.

In the fourth embodiment, the plurality of wires includes a first wire 110 and a second wire 120, the first exposed section 111 or the second exposed section 122 is bent to deviate from its corresponding hypothetical axis, and first exposed section 111 and the second exposed section 122 deviate from each other on the hypothetical plane. The electrodes on the mounting side of the LED device 150 are soldered to the first exposed section 111 and the second exposed section 122. A relatively large distance can be maintained between the first exposed section 111 and the second exposed section 122 to fit an LED device 150 with a larger size, instead of limiting the size of the LED device 150 to the distance between the first wire 110 and the second wire 120 when the wires are straight and parallel to each other.

Figure 23:
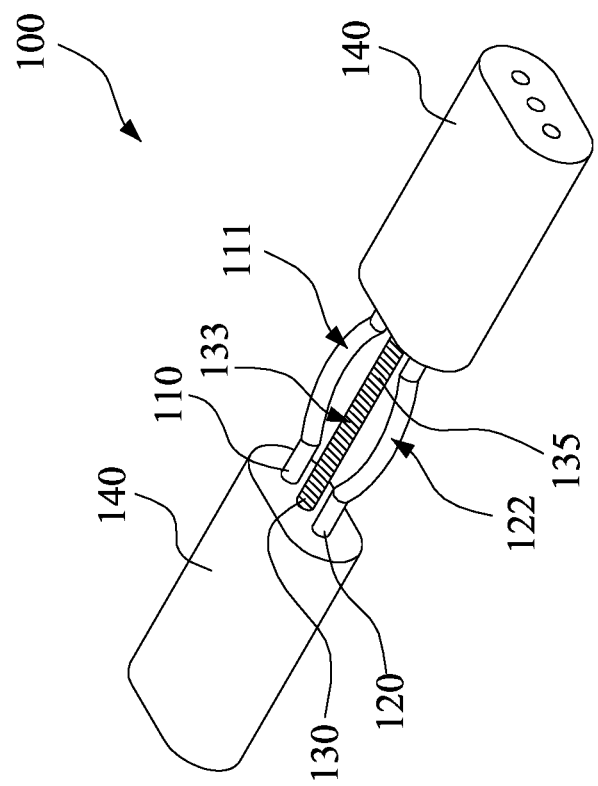
FIG. 23 is a perspective view of the insulating parts, the first wire, the second wire and the third wire according to a fifth embodiment of this disclosure.
Figure 24:
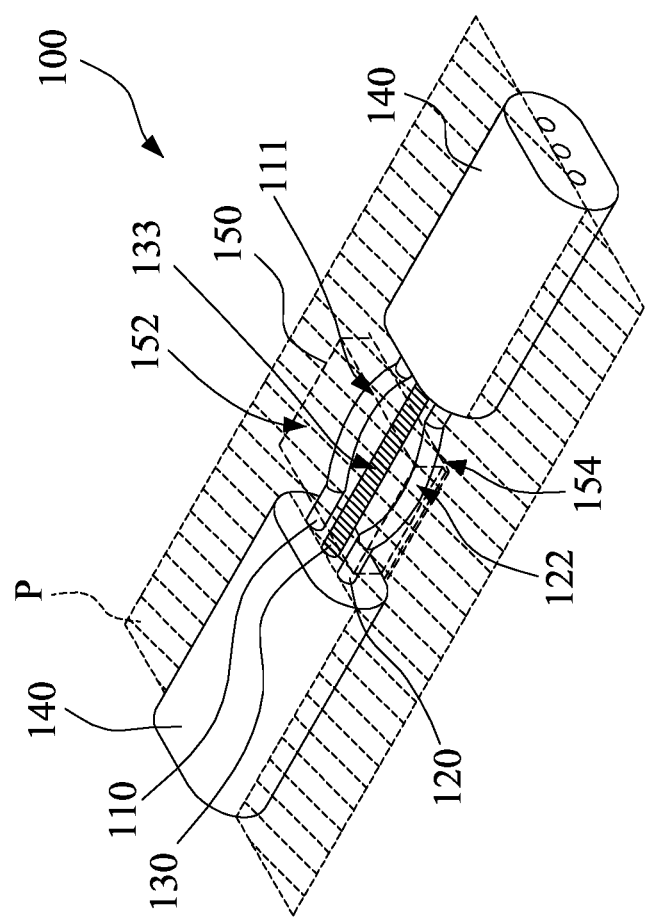
FIG. 24 is a perspective view of a multi-wire light string structure according to the fifth embodiment of this disclosure.

Referring to FIG. 23 and FIG. 24, which illustrate a multi-wire light string structure 100 according to a fifth embodiment of this disclosure, including two insulating portions 140, a first wire 110, a second wire 120, a third wire 130, and an LED device 150, is depicted.

As shown in FIG. 23 and FIG. 24, the third exposed section 133 is located between the first exposed section 111 and the second exposed section 122. The first exposed section 111 and the second exposed section 122 are respectively bent to deviate from the corresponding hypothetical axis and deviate from each other on the hypothetical plane, so as to accommodate the width of the LED device 150. The LED device 150 is located on a upper side of the hypothetical plane, and the mounting sides 154 are soldered to the first exposed section 111 and the second exposed section 122.

As shown in FIG. 23 and FIG. 24, the third exposed section 133 is straight without being bent. And in an embodiment, the third exposed section 133 is covered with an insulating coating layer 135. Therefore, when contacting the mounting side 154 the third exposed section remains electrical insulated from the LED device 150. In the fifth embodiment, the third wire 130 can be an enameled wire to make the third exposed section 133 covered by the insulating coating layer 135.

In an embodiment, the third wire 130 that is an enameled wire is a metal conductor coated with enamel, and substantially the entire wire is coated with enamel, including those portions of the third wire 130 that are covered by the insulation portions 140. In other embodiments, the insulating coating layer 135 is a layer other than enamel, such as a plastic coating or other insulating material. In an embodiment, the insulating coating layer does not coat substantially the entire length of the third wire 130, but only coats the exposed sections in the gap G. In one such embodiment, the insulating coating layer is added to the third wire 130 at only the exposed section 133 after the insulating portion 140 is removed from the cable.

In an embodiment, the insulating coating layer 135 comprises a different material as compared to the insulating portions 140, such as an enamel coating and a PVC material, for example. In another embodiment, insulating coating layer 135 may comprise the same material as the insulating portions 140, such as PVC. In one such embodiment, the insulating coating layer 135 may be added to wire 130 and exposed section 133 prior to insulating portions 140 being added to wire 130, such as 130 being an insulated wire with insulating material of insulating portions 140 being extruded over insulated wire 130.

Figure 25:
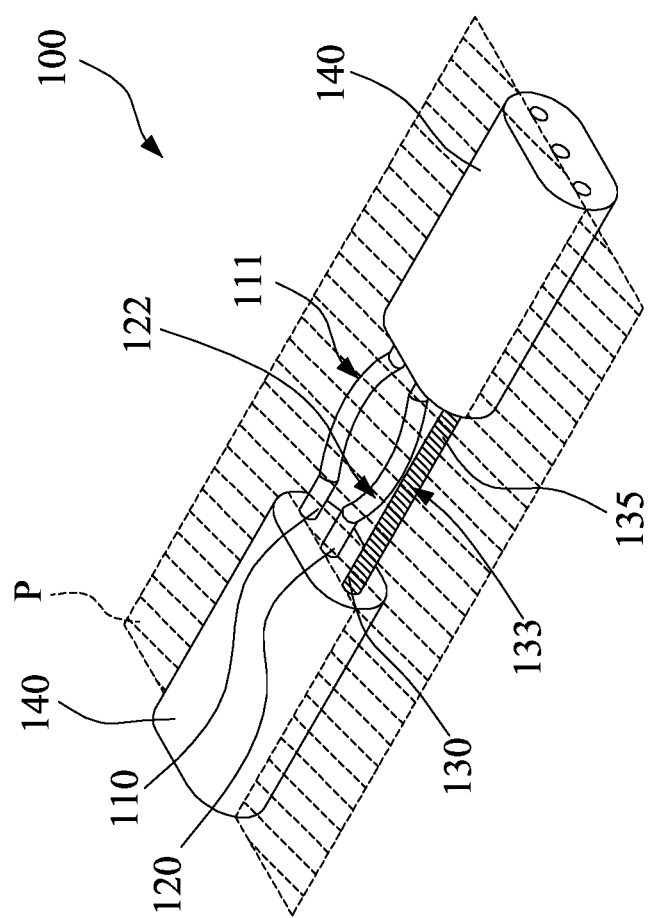
FIG. 25 is another perspective view of the insulating parts, the first wire, the second wire and the third wire according to the fifth embodiment of this disclosure.

As shown in FIG. 25, the arrangement of the first exposed section 111, second exposed section 122 and third exposed section 133 can be that the first exposed section 111 and the second exposed section 122 are adjacent to each other, and the third exposed section 133 is adjacent to the first exposed section 111 or the second exposed section 122. The first exposed section 111 and the second exposed section 122 are respectively bent to deviate from their corresponding hypothetical axes and first exposed section 111 and the second exposed section 122 deviate from each other on the hypothetical plane. The third exposed section 133 is straight without being bent. The third exposed section 133 is covered an insulating coating layer. The third exposed section 133 in the abovementioned embodiments can be replaced by a third exposed section 133 that is not bent and is covered by and insulating coating layer.

Figure 26:
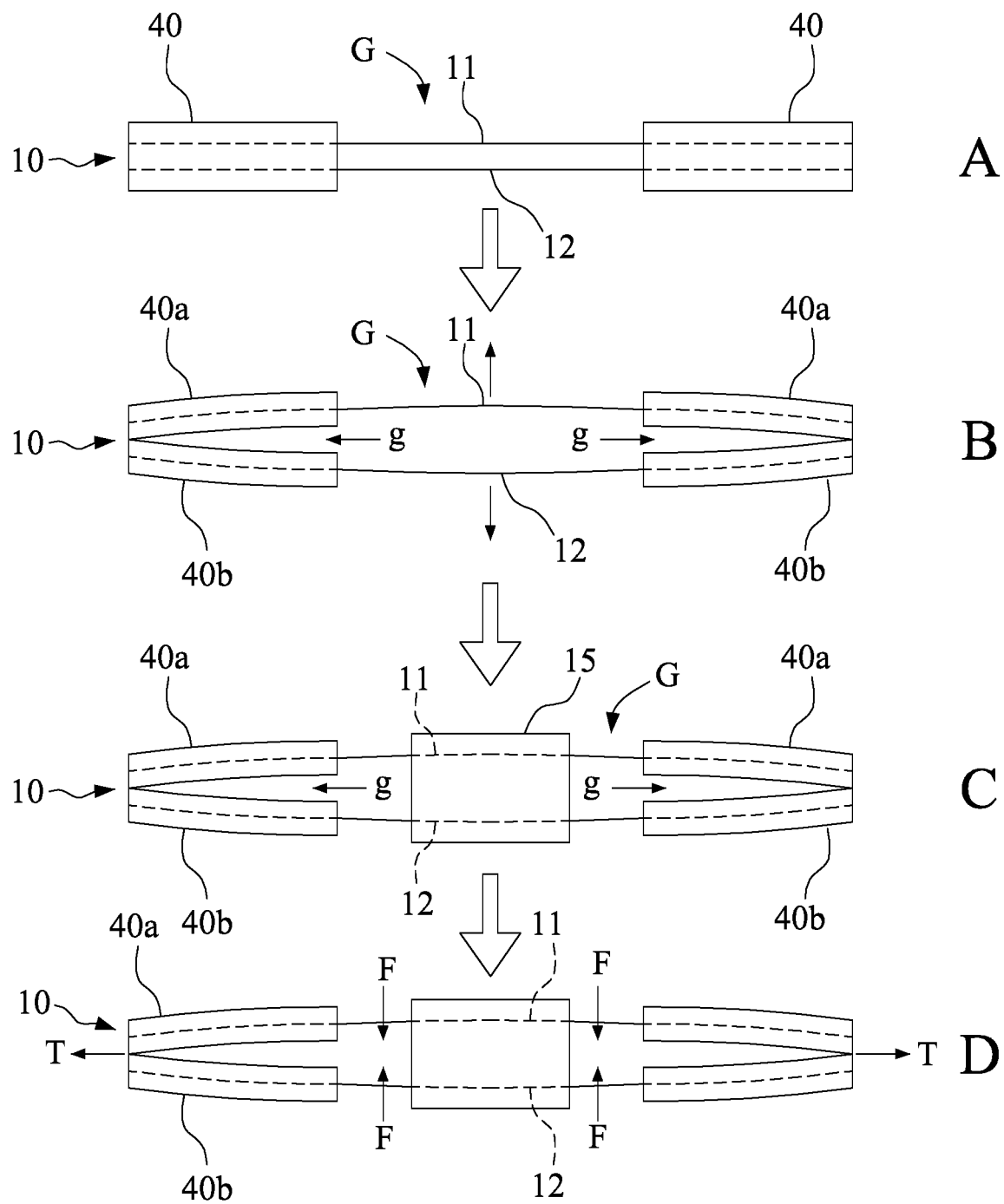
FIG. 26 is a top view of a light string structure, according to the prior art.
Figure 27:
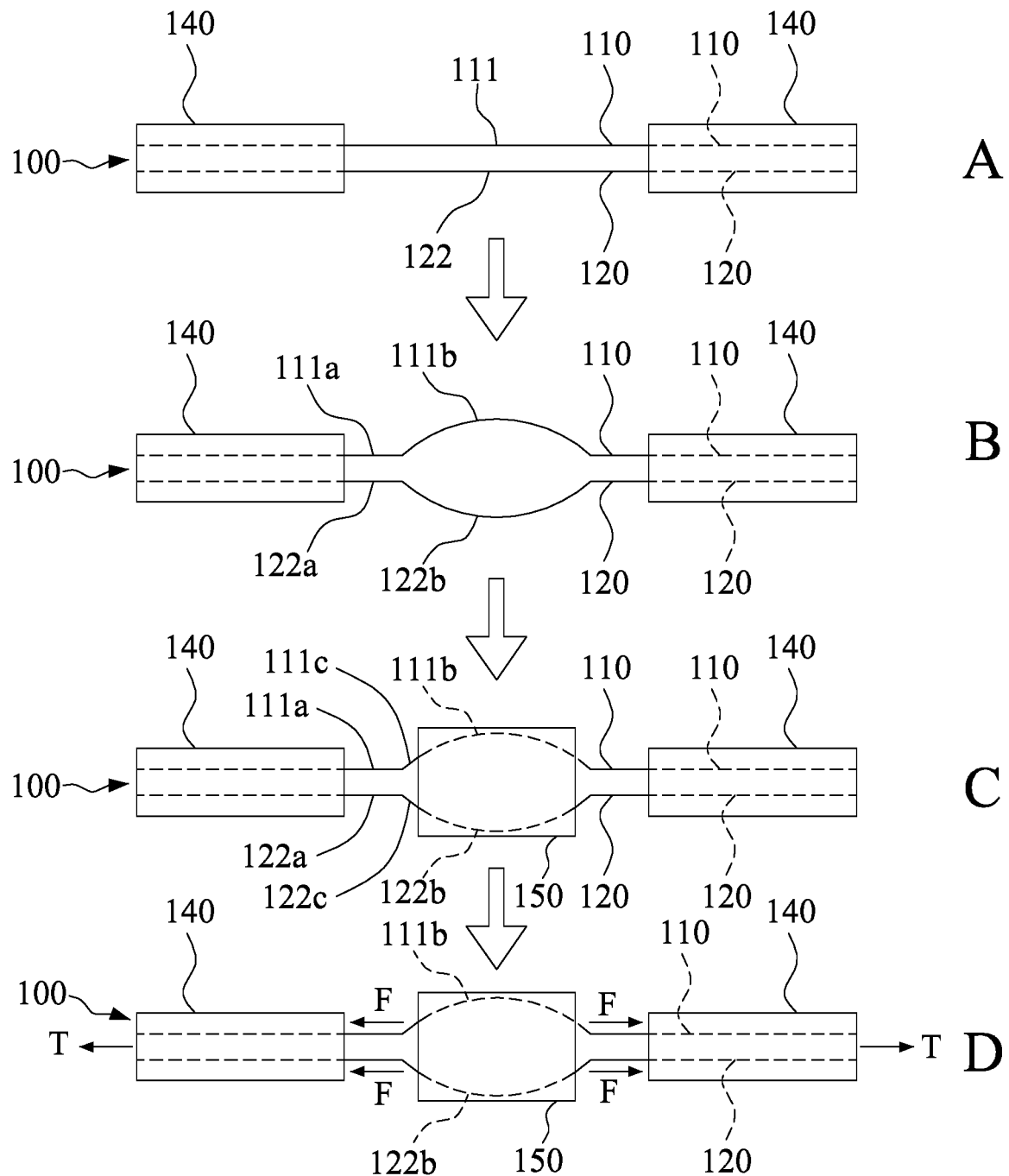
FIG. 27 is a tope view of a light string structure, according to an embodiment of this disclosure.

Referring to FIGS. 26 and 27, a comparison of light-string structure 100 of the disclosure is compared to another light-string structure 10 that does not include the features of the present disclosure, is depicted.

Referring specifically to FIG. 26, light-string structure 10, includes two insulating portions 40 (depicted on left and right), first wire 11, second wire 12, and LED device 50. Light-string structure 10 is depicted at three steps of manufacturing, Steps A, B and C, and a use step D.

At step A, portions of wire insulation have been removed, such that wires 11 and 12 are not insulated, and a gap G is formed between the two insulation portions 40.

At step B, a radial separating force is applied to wires 11 and 12, as indicated by the arrows, and a distance between wires 11 and 12 is increased. Also, each insulation portion 40 at gap G may be split such that the insulated portions 40a and 40b of wires 11 and 12 become separated from one another, rather than being maintained in their original connected, integral form. A small gap g, or space separates insulated wire portions 40a and 40b. Wires 11 and 12 define a long arc with a large curvature from the point of separation of the insulation to the point where wires 11 and 12 are not insulated. Unlike the insulated portion of each wire 11 and 12 that may be partially curved, all or a portion of uninsulated wires 11 and 12 may be held straight, rather than curved. In one case, a spacer may be inserted between the wires to hold them in position.

At Step C, an LED device 50 is soldered to wires 11 and 12.

Step D depicts a tension T being placed on light structure 10, which may occur when light structure 10, embodied in a light string, is used, or handled by a user. Tension T generates forces F, which may be shear forces, directed in a radially-inward direction. Such forces can cause one or more solder joints or connections of LED device 50 to wires 11 and 12 to be loosened, broken, disconnected, or otherwise compromised. Such a situation is avoided with the light-string structure 100 of the disclosure.

Referring to FIG. 27, an embodiment of a multi-wire light-string structure 100 is depicted. Light-string structure 100 as depicted includes insulating portions 140, first wire 110 with first exposed section 111, and second wire 120 with second exposed section 122. Gap G is formed between opposing insulating portions 140. Light-string structure 100 is depicted at three steps of manufacturing, Steps A, B and C, and a use Step D.

At Step A, portions of wire insulation have been removed, such that wires 110 and 120 are not insulated, forming exposed sections 111 and 122 (before bending/curvature) and a gap G is formed between the two insulation portions 140.

At Step B, portions of exposed sections 111 and 122 are bent, as described above, to form bent or curved sections of wires 110 and 120, respectively. In an embodiment, and as depicted, portions 111a and 122a of exposed sections 111 and 122 may not be bent or curved, and may be maintained as linear or straight sections of wire. Such embodiments are described in detail above with respect to FIGS. 1-25.

Further with respect to Step B, a force is applied to initially-straight portions of exposed sections 111 and 122 to form bent or curved sections 111b and 122b. In an embodiment, the bend or curvature is a permanent deformation of wires 110 and 120 having a relatively small curvature, such that after the force is removed from exposed sections 111 and 122, wires 110 and 120 are not under tension.

At Step C, LED device 150 is soldered to bent portions 111b and 122b. In an embodiment, and as depicted, a portion of each bent portion 111b and 122b is not soldered or connected to LED device 150, namely, portions 111c and 122c. As such, between each insulating portion 140 and LED device 150, part of exposed section 111 includes a short straight section 111a and a bent section 111c, and part of exposed section 122 includes a short straight section 122a and a bent section 122c, none of which are insulated or soldered to LED device 150. As depicted, this is the same structure on both sides of LED device 150 (left side and right side as depicted in FIG. 27). Such an embodiment may be beneficial in distributing or absorbing pulling forces, such as light-string tensional force T, minimizing the force that is applied to the solder connection of the wires to LED device 150.

At Step D, when light-string structure 100 is in use, a pulling force or tension T may be applied to the structure, forces F are imparted to structure 100. These forces are distributed differently as compared to the structure of FIG. 26, and to a certain extent more parallel with the direction of the tension T. Although not depicted, it will also be understood that some of the force will be expended in deforming sections 111a and 111c, as well as 122a and 122c, imparting less force on the solder connection of wires 110 and 120 to LED device 150.

Based on the above disclosure, the various embodiments of a multi-wire light string structure 100 as described are able to be equipped with a relative large LED device soldered on wires with a relatively thin wire diameter. The LED device 150 can keep a distance without contact with the additional wire that does not need to be soldered thereon. This approach simplifies short-circuit protection measures, and effectively avoids the occurrence of a short-circuit condition between the LED device 150 and the additional wire.

What is claimed is:

1. A multi-wire light string structure comprising:
two insulating portions arranged to define a gap;
a plurality of wires, each of the plurality of wires including two wire portions embedded in the two insulating parts and an exposed section in the gap; wherein the wire portions of the plurality of wires are located on a hypothetical plane, the two wire portions of each of the plurality of wires extend along a respective lengthwise wire axis, and at least one exposed section of the plurality of wires is bent to deviate from its corresponding lengthwise wire axis; and
an LED device including a light-emitting side and a mounting side, wherein the LED device is located on an upper side of the hypothetical plane, and the mounting side is soldered to at least two of the exposed sections, such that the LED device is positioned entirely above the exposed sections of each of the plurality of wires;
wherein the plurality of wires includes a first wire, a second wire, and a third wire, the exposed section of the third wire is bent and protrudes from a lower side of the hypothetical plane, and the mounting side is soldered to the exposed sections of the first wire and the second wire.

2. The multi-wire light string structure according to claim 1, wherein the LED device does not contact the exposed section of the third wire.

3. The multi-wire light string structure according to claim 1, wherein the exposed section of the third wire is located between and below the exposed sections wires of the first wire and the second wire.

4. The multi-wire light string structure according to claim 3, wherein the exposed section of the first wire and the exposed section of the second wire are respectively bent to deviate from their corresponding lengthwise wire axes, and deviate from each other on the hypothetical plane.

5. The multi-wire light string structure according to claim 3, wherein the exposed section of the first wire and the exposed section of the second wire respectively include a bump protruding from the upper side of the hypothetical plane.

6. The multi-wire light string structure according to claim 5, wherein the multi-wire light string structure comprises two LED devices, and on the exposed sections of first wire and the second wire the two LED devices are spaced apart by the bumps.

7. The multi-wire light string structure according to claim 1, wherein the plurality of wires includes a first wire, a second wire, and a third wire, and wherein the exposed sections of the first wire and the second wire are adjacent to each other, an exposed section of the third wire is adjacent to the exposed section of the first wire or the second wire, and the exposed section of the third wire is bent to deviate from its corresponding lengthwise wire axis and protrudes from a lower side of the hypothetical plane.

8. The multi-wire light string structure according to claim 7, wherein the exposed sections of the first wire and the second wire are respectively bent to deviate from their corresponding lengthwise wire axes, and deviate from each other on the hypothetical plane.

9. The multi-wire light string structure according to claim 7, wherein the exposed section of the third wire is coated by an insulating coating layer.

10. A multi-wire decorative lighting light string for draping on structures, comprising:
a first wire defining a first lengthwise axis,
a second wire defining a second lengthwise axis,
a third wire defining a third lengthwise axis,
a plurality of insulating portions covering portions of each of the first, second and third wires, each insulating portion of the plurality of insulating portions covering a portion of each of the first, second and third wires and holding the covered portions of each of the first, second and third wires substantially in parallel with one another, the plurality of insulating portions defining a plurality of gaps, each gap of the plurality of gaps is formed between two adjacent insulating portions of the plurality of insulating portions, and an exposed section of each of the first, second and third wires is in the gap, thereby forming a first exposed section of the first wire, a second exposed section of the second wire and a third exposed section of the third wire, in each gap; and
a plurality of light-emitting diode (LED) devices, each of the plurality of LED devices having a first electrode and a second electrode, the first electrode soldered to a first exposed section of the first wire, and the second electrode soldered to a second exposed section of the second wire, and wherein neither of the first electrode and the second electrode is electrically connected to the third exposed section in the gap;
wherein each first exposed section bends away from and out of the first wire axis in a first direction, each second exposed section bends away from and out of the second wire axis in a second direction, and each third exposed section bends away from and out of the third wire axis in a third direction.

11. The light string of claim 10, wherein the first direction is opposite to the second direction such that a distance between a first exposed section and a second exposed section in a common gap is greater than a distance between a portion of a first wire covered by an insulating portion and a second wire covered by the insulating portion.

12. The light string of claim 11, wherein a minimum distance between the first electrode and the second electrode of each of the plurality of LED devices is greater than the distance between the portion of the first wire covered by the insulating portion and the second wire covered by the insulating portion.

13. The light string of claim 12, wherein the third direction is transverse to the first direction and to the second direction.

14. The light string of claim 13, wherein the third direction is a direction extending transversely and away from a mounting surface of the LED device.

15. The light string of claim 14, wherein the third exposed section does not contact any portion of the LED device.

16. The light string of claim 10, further comprising a translucent material covering each LED device, each of the first, second and third exposed sections of each of the gaps, and contacting a portion of each of the plurality of insulating portions.

17. A multi-wire light string structure comprising:
two insulating portions arranged to define a gap;
a plurality of wires, including a first wire, a second wire, and a third wire, each of the plurality of wires including two wire portions embedded in the two insulating parts and an exposed section in the gap; wherein the wire portions of the plurality of wires are located on a hypothetical plane, the two wire portions of each of the plurality of wires extend along a respective lengthwise wire axis, and at least one exposed section of the plurality of wires is bent to deviate from its corresponding lengthwise wire axis; and
an LED device including a light-emitting side and a mounting side, wherein the LED device is located on an upper side of the hypothetical plane, and the mounting side is soldered to at least two of the exposed sections,
wherein the exposed sections of the first wire and the second wire are adjacent to each other, the exposed section of the third wire is adjacent to the exposed section of the first wire or the second wire, and the exposed section of the third wire is bent to deviate from its corresponding lengthwise wire axis and protrudes from a lower side of the hypothetical plane.

18. The multi-wire light string structure according to claim 17, wherein the exposed sections of the first wire and the second wire are respectively bent to deviate from their corresponding lengthwise wire axes, and deviate from each other on the hypothetical plane.

19. The multi-wire light string structure according to claim 17, wherein the exposed section of the third wire is coated by an insulating coating layer.

20. A multi-wire light string structure comprising:
two insulating portions arranged to define a gap;
a plurality of wires, each of the plurality of wires including two wire portions embedded in the two insulating parts and an exposed section in the gap; wherein the wire portions of the plurality of wires are located on a hypothetical plane, the two wire portions of each of the plurality of wires extend along a respective lengthwise wire axis, and at least one exposed section of the plurality of wires is bent to deviate from its corresponding lengthwise wire axis; and
an LED device including a light-emitting side and a mounting side, wherein the LED device is located on an upper side of the hypothetical plane, and the mounting side is soldered to at least two of the exposed sections, such that the LED device is positioned entirely above the exposed sections of each of the plurality of wires; and
wherein the plurality of wires includes a first wire, a second wire, and a third wire, and wherein the exposed sections of the first wire and the second wire are adjacent to each other, an exposed section of the third wire is adjacent to the exposed section of the first wire or the second wire, and the exposed section of the third wire is bent to deviate from its corresponding lengthwise wire axis and protrudes from a lower side of the hypothetical plane.

21. The multi-wire light string structure according to claim 20, wherein the exposed sections of the first wire and the second wire are respectively bent to deviate from their corresponding lengthwise wire axes, and deviate from each other on the hypothetical plane.

22. The multi-wire light string structure according to claim 20, wherein the exposed section of the third wire is coated by an insulating coating layer.

* * * * *